United States Patent
Nesnidal et al.

(10) Patent No.: US 6,649,439 B1
(45) Date of Patent: Nov. 18, 2003

(54) SEMICONDUCTOR-AIR GAP GRATING FABRICATION USING A SACRIFICIAL LAYER PROCESS

(75) Inventors: Michael P. Nesnidal, Oregon, WI (US); David V. Forbes, Oregon, WI (US)

(73) Assignee: Northrop Grumman Corporation, Redondo Beach, CA (US)

( * ) Notice: Subject to any disclaimer, the term of this patent is extended or adjusted under 35 U.S.C. 154(b) by 0 days.

(21) Appl. No.: 10/210,799

(22) Filed: Aug. 1, 2002

(51) Int. Cl.[7] .................................................. H01L 21/20
(52) U.S. Cl. ............................................ 438/32; 438/481
(58) Field of Search .............................. 438/22, 24, 31, 438/39–44, 46, 478, 479, 481, 483, 767, 778, 779, 700, 702

(56) References Cited

U.S. PATENT DOCUMENTS

| | | | | |
|---|---|---|---|---|
| 5,955,749 A | * | 9/1999 | Joannopoulos et al. | 257/98 |
| 6,358,854 B1 | * | 3/2002 | Flemming et al. | 438/690 |
| 6,365,428 B1 | * | 4/2002 | Zubrzycki et al. | 438/32 |
| 6,468,823 B1 | * | 10/2002 | Scherer et al. | 438/31 |
| 2002/0159126 A1 | * | 10/2002 | Sigalas et al. | 359/245 |

FOREIGN PATENT DOCUMENTS

EP  99308245.2  * 10/1999

* cited by examiner

Primary Examiner—Savitri Mulpuri
(74) Attorney, Agent, or Firm—John A. Miller, Esq.; Warn, Burgess & Hoffmann, P.C.

(57) ABSTRACT

An optical device (10) including a first semiconductor layer (12) on which is deposited a dielectric layer that is patterned and etched to form dielectric strips (14) as part of a diffraction grating layer. Another semiconductor layer (16) is grown on the first semiconductor layer (12) between the dielectric strips (14) to provide alternating dielectric sections (14) and semiconductor sections. In an alternate embodiment, a dielectric layer is deposited on a first semiconductor layer (64), and is patterned and etched to define dielectric strips (66). The semiconductor layer (64) etched to form openings (68) between the dielectric strips (66). A semiconductor material (70) is grown within the openings (68) and then another semiconductor layer (72) is grown over the entire surface after removing the dielectric strips. Either embodiment may be modified to provide a diffraction grating with air channels (20).

11 Claims, 3 Drawing Sheets

SEMICONDUCTOR-AIR GAP GRATING FABRICATION USING A SACRIFICIAL LAYER PROCESS

BACKGROUND OF THE INVENTION

1. Field of the Invention

This invention relates generally to semiconductor diffraction gratings and, more particularly, to a semiconductor structure that includes semiconductor epitaxial layers lattice matched to each other and including a diffraction grating therebetween, where the semiconductor layers and the diffraction grating material having a greater difference in their indexes of refraction than the difference in the indexes of refraction of the semiconductor layers.

2. Discussion of the Related Art

There is a need in the art for optical semiconductor diffraction gratings in certain optical semiconductor devices, such as distributed feedback (DFB) optical filters, optical couplers, etc. A conventional optical semiconductor diffraction grating will typically include a semiconductor waveguide layer positioned between outer cladding layers, where the waveguide layer has a higher index of refraction than the cladding layers so that light propagates down the waveguide layer by reflecting off of the cladding/waveguide interfaces and is trapped therein. The diffraction grating is formed at the interface between one of the cladding layers and the waveguide layer by fabricating a ripple or corrugated structure on one of either the waveguide surface or the cladding layer surface so that as the light is reflected off of the interface, it interacts with the grating. Thus, the diffraction layer is the periodic longitudinal index difference between the peaks and troughs defined between the semiconductor layers forming a grating region. As the light propagates down the waveguide layer, the wavelength of light related to the periodic index change or spatial period of the peaks in the diffraction layer is reflected backwards or transmitted through the waveguide layer in such a manner that it is separated from the other wavelengths of light to provide for example, optical filtering.

Processing techniques for fabricating the conventional grating interfaces in semiconductor devices are well established. The grating can be formed on the waveguide layer or cladding layer surface by direct electron beam writing or holography patterning, both well understood to those skilled in the art. In order to make the interfaces between the waveguide layer and the cladding layers of a high optical quality with minimum defects and imperfections, it is desirable to use a semiconductor epitaxial growth process, such as metal-organic chemical vapor deposition (MOCVD) or molecular beam epitaxy (MBE), to provide crystal nucleation and growth and lattice matching between these layers. Because the waveguide layer must have a higher index of refraction than the cladding layers, the waveguide layer must be made of a different semiconductor material or material composition than the cladding layers. However, to provide the necessary crystal structure and lattice matching during the semiconductor fabrication process, the waveguide layer and the cladding layers must be compatible to allow the crystal growth process to occur.

The interaction of the optical modes in the waveguide layer is a function of the differences in the indexes of refraction in the diffraction layer formed by the semiconductor layers, which is characterized by a grating coupling coefficient. The semiconductor materials that are compatible and satisfy the crystal growth requirement have nearly the same indexes of refraction, and thus, the optical wavelength separation capability provided by the diffraction grating layer in these devices is limited. In other words, because the crystal growth process requires that the waveguide and cladding materials have nearly the same index of refraction, the optical filtering capability, or other optical wavelength separation process, is limited. Typical semiconductor indexes of refraction are approximately 3, and the difference between compatible semiconductor materials is usually at most about 0.5.

The small difference in the indices of refraction between the waveguide layer and the cladding layers is adequate for many applications, such as optical mode pumping in a laser, but for other applications, such as optical filtering, a larger difference between these indices of refraction is desirable. In many applications, a significant improvement in device performance would be achieved if it were possible to fabricate gratings with. much larger coupling coefficients.

To provide semiconductor diffraction gratings of the type discussed above that have a much greater difference between the indexes of refraction within the grating layer, it has heretofore been known to use a wafer-to-wafer bonding technique to bond the waveguide layer and cladding layers together that eliminates some of the restrictions imposed on the semiconductor growth fabrication processes. Different wafer-to-wafer bonding techniques are known in the art, where separate semiconductor structures are adhered together in a non-crystal growth process. By bonding a semiconductor structure to another semiconductor structure that includes the diffraction ripples, an interface is created where air gaps are defined between the peaks in the ripple structure. Therefore, as the optical beam propagates down the waveguide and interacts with the diffraction grating layer, the optical beam sees alternating regions of air and semiconductor material. Because the index of refraction of air is one, there is a significant difference between the materials that define the grating, providing increased filtering capabilities. Wafer-to-wafer bonding, however, has a number of drawbacks making this technique somewhat undesirable for fabricating optical diffraction gratings. Particularly, the wafer-to-wafer bonding process introduces strain between the crystalline structure of the two semiconductor layers that affects the optical interaction in the diffraction layer. Additionally, defects and impurities present at the interface can affect the optical integrity as a result of the bonding process that would not be present during a crystalline growth process. Additionally, the wafer-to-wafer bonding process is relatively expensive to implement, and thus adds a significant level of cost above the typical diffraction grating fabrication process.

What is needed is a process for making an optical diffraction grating that employs semiconductor crystal growth processes, and provides a relatively significant difference between the indices of refraction between the waveguide layer and the cladding layers in a diffraction grating layer for increased optical filtering. It is therefore an object of the present invention to provide such a process.

SUMMARY OF THE INVENTION

In accordance with the teachings of the present invention, an optical device including an optical diffraction grating is disclosed. In one embodiment, the optical device includes a first semiconductor layer on which is patterned and etched a dielectric layer to form dielectric strips. A second semiconductor layer is grown by an epitaxial growth process on the first semiconductor layer between the dielectric strips to enclose the dielectric strips, so that the spaced apart dielectric strips, together with the second semiconductor layer between the strips and up to the height of the strips, define the diffraction grating layer. The dielectric strips can then be etched away to form the diffraction grating with air channels. Subsequent material growth steps determine the location of the waveguide layer. The second semiconductor layer can be made of the same material as the first semiconductor layer and a waveguide layer remotely located, or the second semiconductor layer can be the waveguide itself, as long as it is compatible with the material of the first dielectric layer for the crystal growth process.

In another embodiment, a first semiconductor layer is provided and a dielectric layer is deposited on the first semiconductor layer, and then patterned and etched to define dielectric strips. The semiconductor layer is then exposed to a chemical etch that forms openings in the semiconductor layer between the dielectric strips. Another semiconductor material is grown within the openings in the first semiconductor layer by an epitaxial growth process, and then the dielectric strips are etched away. Another semiconductor layer is grown on the first layer and the diffraction regions. The semiconductor material in the diffraction regions can be a sacrificial material that is etched away to form the diffraction grating with air channels. As above, additional semiconductor layers can be provided to define a waveguide layer between cladding layers where light propagating down the wave guide layer interacts with the diffraction layer, or the waveguide layer can be remotely located.

Additional objects, advantages, and features of the present invention will become apparent in the following description independent claims, taken in conjunction with the accompanying drawings.

DETAILED DESCRIPTION OF THE PREFERRED EMBODIMENTS

The following discussion of the preferred embodiments directed to a semiconductor optical diffraction device and method of making same is merely exemplary in nature and is in no way intended to limit the invention or its applications or uses.

Figure 1:
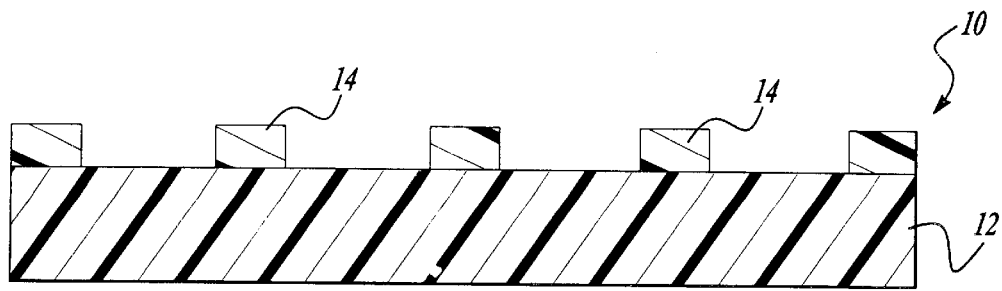
FIGS. 1–3 show cross-sectional views of several fabrication steps of a semiconductor optical diffraction grating structure, according to an embodiment of the present invention.

FIG. 1 is a cross-sectional view of a fabrication step for an optical diffraction grating structure 10, according to an embodiment of the present invention. The grating structure 10 includes a semiconductor layer 12 that has been grown by an epitaxial growth process, such as MOCVD or MBE, on a compatible semiconductor substrate. After the semiconductor layer 12 has been grown to the desired thickness for a particular optical application, the wafer is removed from the crystal growth apparatus, and a dielectric layer, for example silicon dioxide or silicon nitride, is deposited on a top surface of the semiconductor layer 12. The dielectric layer is patterned by a suitable semiconductor patterning process, such as a holography or electron beam writing exposure technique, to define a pattern of dielectric diffraction grating strips 14. An etching process, such as any suitable chemical or plasma based etch, is used to etch away the unwanted portions of the dielectric layer between the strips 14. The etch is selectively controlled so that the unwanted dielectric portions of the dielectric layer are etched far enough down to expose the layer 12 between the strips 14, as shown in FIG. 1.

Figure 2:
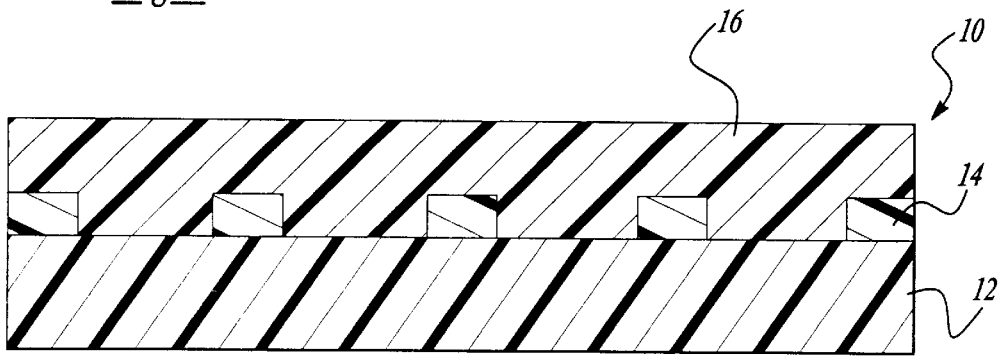

Once the dielectric grating strips 14 have been formed on the layer 12, the structure 10 is returned to the semiconductor growth apparatus. FIG. 2 shows a subsequent fabrication step of the structure 10 where a second semiconductor layer 16 has been grown on the layer 12 by an epitaxial re-growth process. The layer 16 is lattice matched or nearly lattice matched to the layer 12 that is exposed between the strips 14 to define the layer 16. The growth process is continued until the strips 14 are completely enclosed. For purposes of the present discussion, the layer 12 and the layer 16 are made of the same semiconductor material, but as will become apparent form the discussion below, the layer 16 can be a different semiconductor material than the layer 12, as long as it is compatible for the growth process. The dielectric strips 14 define a diffraction grating for an optical device, such as a filter. The dielectric material of the strips 14 has an index of refraction from about 1.5 to 2, making the difference in the index of refraction between the strips 14 and the semiconductor material greater than the difference between the standard epitaxial growth semiconductor diffraction gratings.

Figure 3:
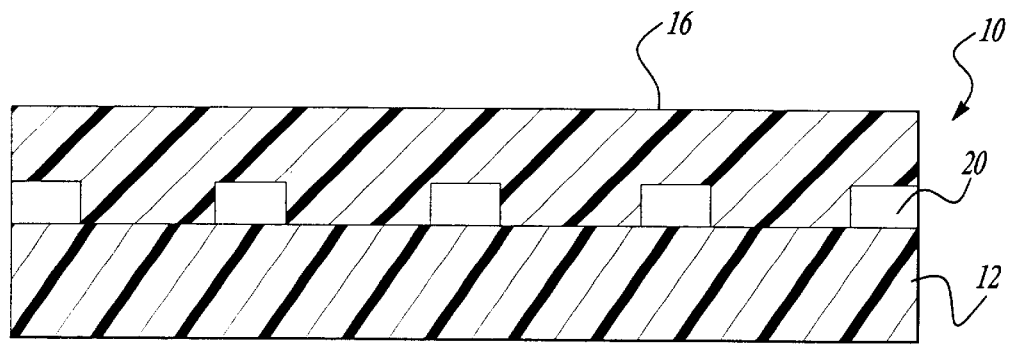
Figure 4:
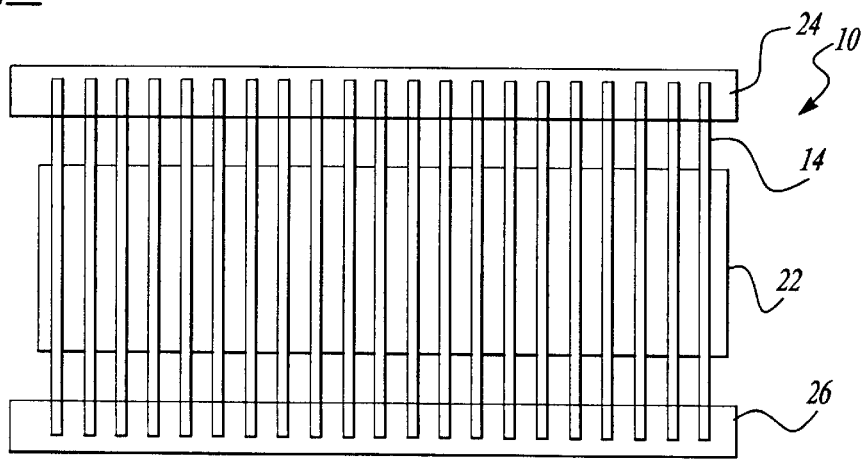
FIG. 4 is a top view of a fabrication step of the semiconductor optical diffraction grating structure shown in FIG. 3.

The difference in the index of refraction between the diffraction strips 14 and the semiconductor material can be further increased by removing the dielectric strips 14 after the re-growth step to define air channels 20, as shown in FIG. 3. FIG. 4 shows a top view of the structure 10 depicting a fabrication process for selectively removing the strips 14 once the layer 16 has been fabricated. An optical device region 22 is defined in the structure 10 that represents the usable optical area for the final optical device. The optical beam will propagate down the region 22 transverse to the strips 14. Via etching channels 24 and 26 are patterned and etched down through a top surface of the structure 10 by a suitable masking and etching process until the ends of the strips 14 are exposed to air. A suitable etchant is then introduced into the via channels 24 and 26 that selectively removes the strips 14 to form the air channels 20. The etching process is complete when the entire length of the strips 14 have been removed to define the air channels 20. If necessary, the channels 20 can be sealed by depositing a passivating and dielectric film into the via channels 24 and 26 that is sufficient to close the channel openings.

Figure 5:
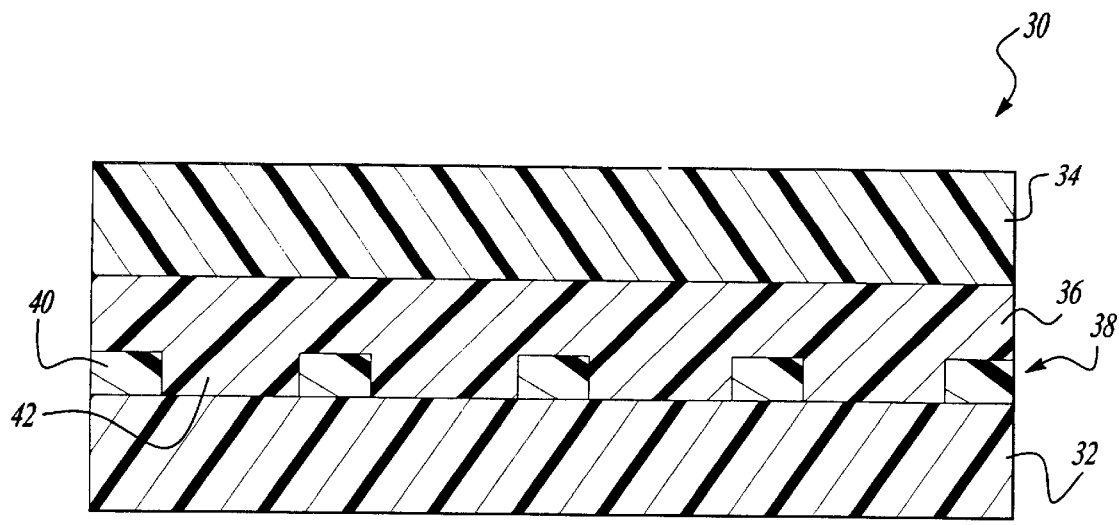
FIG. 5 is a cross-sectional view of an optical device including a semiconductor optical diffraction grating structure according to the present invention.

The structure 10 as fabricated by the process described above can be used for different optical devices, in accordance with the teachings of the present invention. FIG. 5 shows a cross-sectional view of an optical device 30 including a bottom semiconductor cladding layer 32 representing the layer 12 and a top semiconductor cladding layer 34. For the device 30, the semiconductor layer 16 is a semiconductor waveguide layer 36 having a higher index of refraction than the cladding layers 32 and 34 such that an optical wave propagating down the waveguide layer 36 is substantially confined therein. In this embodiment, a diffraction grating layer 38 is defined at the interface between the waveguide layer 36 and the cladding layer 32, and includes periodically spaced dielectric strips 40, representing the strips 14, and semiconductor regions 42 grown between the strips 40 that are part of the crystal re-growth making up the waveguide layer 36. When the structure 10 is reintroduced back into the crystal growth apparatus after the strips 14 have been patterned, the waveguide layer 36 is regrown as a compatible semiconductor material that is different than the material making up the cladding layer 32. The cladding layer 34 is then grown on the waveguide layer 36, and is the same material as the cladding layer 32. Therefore, all of the layers 32, 34 and 36 are compatible for the crystal growth process. The strips 40 can be removed to define the air channels 20 in the manner as discussed above.

Figure 6:
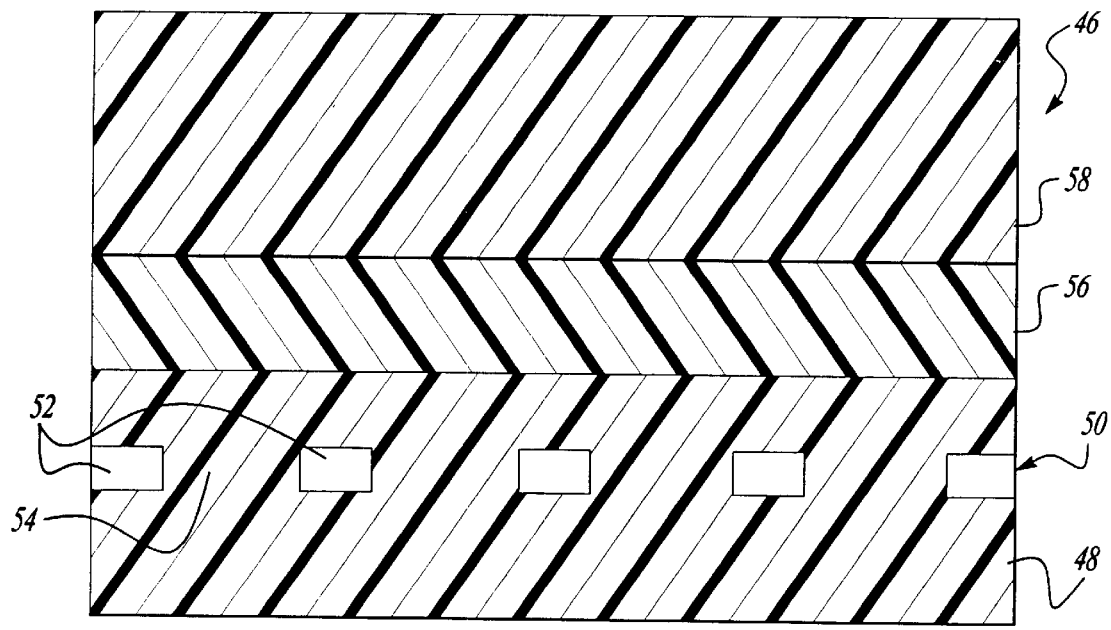
FIG. 6 is a cross-sectional view of an optical device including another semiconductor optical diffraction grating structure according to the present invention.
Figure 7:
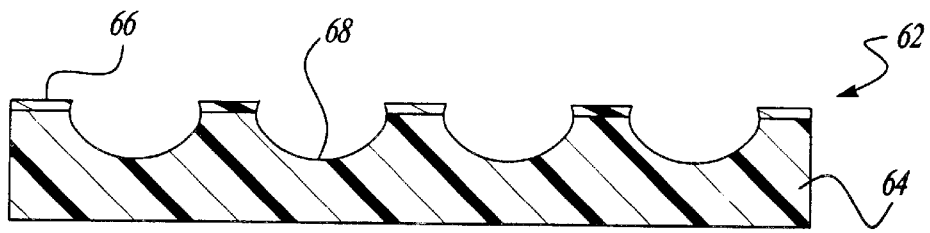
FIGS. 7–10 show cross-sectional views of a fabrication process of an optical semiconductor diffraction grating structure, according to another embodiment of the present invention.
Figure 8:
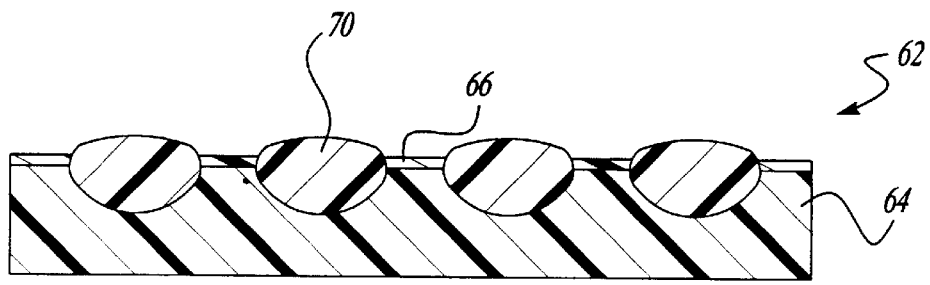

FIG. 6 is a cross-sectional view of another optical device 46 including a lower cladding layer 48 having a diffraction grating layer 50 defined by air channels 52 separated by semiconductor regions 54. In this design, the re-growth layer 16 is made of the same material as the layer 12 to define the cladding layer 48, and the diffraction layer 50 is an embedded diffraction layer. Instead of removing the strips 14 to make the air channels 52, the strips 14 can be retained to provide a different type of optical device, as discussed above. Once the layer 16 has been regrown to define the layer 48, a waveguide layer 56 having a higher index of refraction than the cladding layer 48 is grown on the cladding layer 48, and an upper cladding layer 58 is grown on the waveguide layer 56. The wave propagating down the waveguide layer 56 has modes that penetrate into the cladding layer 48 and contact the diffraction layer 50 for optical filtering purposes, as would be appreciated by those skilled in the art. Any combination of cladding layer, diffraction grating layer and waveguide layer can be provided within the scope of the present invention, consistent with the discussion above, where compatible semiconductor layers are epitaxially grown on top of each other.

FIGS. 7–10 show cross-sectional views depicting fabrication steps of an optical diffraction grating structure 62 to be employed in an optical diffraction device, according to another embodiment of the present invention. In this embodiment, a semiconductor layer 64 is grown on a compatible semiconductor substrate (not shown), and a dielectric layer is then deposited on the semiconductor layer 64 and is patterned and etched by a suitable patterning process to define dielectric strips 66. The structure 62 is then exposed to an etchant that etches away the material of the layer 64 between the strips 66, but does not etch the dielectric material to define etched holes 68. The etch is controlled to control the depth and shape of the holes 68. The dielectric strips 66 serve as a mask for the selective epitaxial re-growth of a sacrificial semiconductor material within the holes 68. The structure 62 is then returned to the growth apparatus to grow sacrificial semiconductor regions 70 within the holes 68 to a level approximately equal with the top surface of the layer 64, as shown. The semiconductor material for the regions 70 is a different material than the layer 64 so that the regions 70 can be selectively etched away, but is compatible with the growth process.

Figure 9:
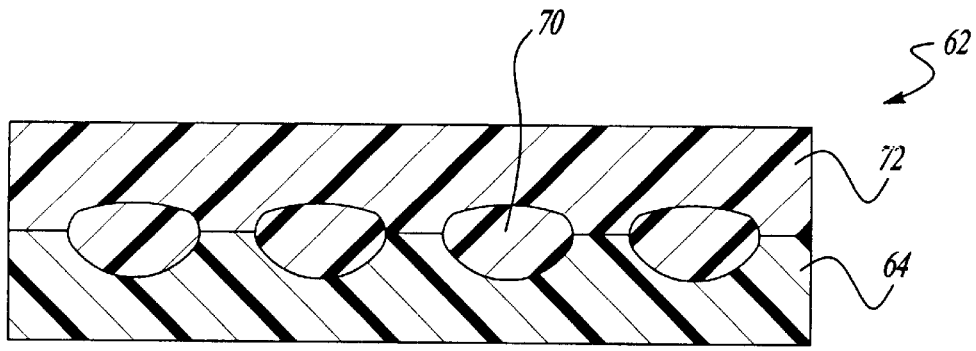
Figure 10:
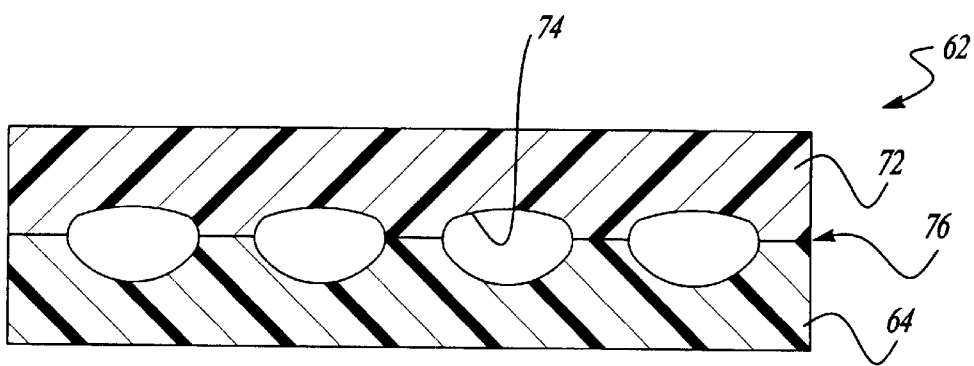

The strips 66 are then removed by a suitable etching process that does not effect the semiconductor material. When the strips 66 have been removed, the structure 62 is put back into the growth apparatus, and another semiconductor layer 72 is grown on the regions 70 and the layer 64 to enclose the regions 70, as shown in FIG. 9. The sacrificial regions 70 can then be removed by the etching process discussed above using the etchant channels 24 nd 26 to provide a structure as shown in FIG. 10 including air channels 74 defining a diffraction grating layer 76. The semiconductor layer 72 can be made of the same semiconductor material as the semiconductor layer 64 or can be another semiconductor material, so that the structure 62 can define an embedded diffraction layer or an interface diffraction layer between a waveguide layer and a cladding layer, consistent with the discussion above.

By providing the air channels 20 and 74, the largest possible coupling coefficient consistent with semiconductor materials can be obtained by the diffraction grating. The accuracy and control of the grating tooth height and shape are significantly improved over traditional fabrication methods. The spatial period between the strips 14 or the channels 74 would depend on the particular wavelength being filtered. The thickness of the strips 14 would depend on how strongly the designer wished to diffract the light, and would be on the order of 1000A. Semiconductor materials that can be used in the optical devices discussed above include InP, InGaAs, GaAs, and other semiconductor materials, as would be appreciated by those skilled in the art. A two-dimensional grating structure for other types of optical devices can also be generated by the processes discussed above.

The foregoing discussion discloses and describes merely exemplary embodiments of the present invention. One skilled in the art will readily recognize from such discussion, and from the accompanying drawings and claims, that various, changes, modifications and variations can be made therein without departing from the spirit and scope of the invention as defined in the following claims.

What is claimed is:

1. A method of making an optical diffracting device, said method comprising the steps of:

growing a first semiconductor layer on a semiconductor substrate, said first semiconductor layer being made of semiconductor material having an index of refraction;

depositing a dielectric layer on the first semiconductor layer;

patterning and etching the dielectric layer to form openings in the dielectric layer to expose selective areas on the first semiconductor layer;

etching the first semiconductor layer to form recesses through the openings in the dielectric layer, wherein the recesses do not extend completely through the first semiconductor layer so that the dielectric layer acts as a mask; and growing diffraction regions in the recesses in the first semiconductor layer by a crystal growth process with a semiconductor material that is compatible with the material of the first semiconductor layer, said diffraction region material having an index of refraction that is different than the index of refraction of the first semiconductor layer.

2. The method according to claim 1 wherein the step of growing diffraction regions includes growing the diffraction regions to a level approximately even with a top surface of the first semiconductor layer.

3. The method according to claim 1 further comprising the steps of removing the dielectric layer after growing the diffraction regions and growing a second semiconductor layer on the first semiconductor layer by an epitaxial growth process in contact with the diffraction regions.

4. The method according to claim 3 wherein the step of growing the second semiconductor layer includes growing the second semiconductor layer to be made of a semiconductor material that is different than the material of the first semiconductor layer so that the second semiconductor layer has a different index of refraction than the index of refraction of the first semiconductor layer.

5. The method according to claim 3 wherein the step of growing the second semiconductor layer includes growing the second semiconductor layer to be made of the same material as the first semiconductor layer so that the diffraction regions are embedded regions.

6. The method according to claim 3 further comprising the steps of etching access vias through the second semiconductor layer to expose the diffraction regions and etching the diffraction region material to make the diffraction regions out of air.

7. The method according to claim 1 wherein the step of patterning and etching the dielectric layer includes patterning and etching the dielectric layer to form strips in the dielectric layer so that the step of growing diffraction regions includes growing strips of diffraction regions in the first semiconductor layer.

8. A method of making an optical diffracting device, said method comprising the steps of:

growing a first semiconductor layer on a semiconductor substrate;

depositing a dielectric layer on the first semiconductor layer;

patterning and etching the dielectric layer to form openings in the dielectric layer to expose selective areas on the first semiconductor layer where the openings define substantially parallel strips;

etching holes in the first semiconductor layer through the strip openings in the dielectric layer so that the dielectric layer acts as a mask;

growing sacrificial regions in the etched holes in the first semiconductor layer with a semiconductor material that is compatible for epitaxial growth with the material of the first semiconductor layer, said sacrificial region semiconductor material having an index of refraction that is different than the index of refraction of the first semiconductor layer;

removing the dielectric layer;

growing a second semiconductor layer on the first semiconductor layer in contact with the sacrificial regions by an epitaxial growth process;

etching access vias through the second semiconductor layer to expose the sacrificial regions; and etching away the sacrificial region material through the etching access vias to define a diffraction grating made out of channels of air.

9. The method according to claim 8 wherein the step of growing sacrificial regions includes growing the sacrificial regions to a level approximately even with a top surface of the first semiconductor layer.

10. The method according to claim 8 wherein the step of growing the second semiconductor layer includes growing the second semiconductor layer to be made of a semiconductor material that is different than the material of the first semiconductor layer so that the material of the second semiconductor has a different index of refraction than the index of refraction of the first semiconductor layer.

11. The method according to claim 8 wherein the step of growing the second semiconductor layer includes growing the second semiconductor layer to be made of the same material as the first semiconductor layer so that the diffraction regions are embedded regions.

* * * * *